(12) United States Patent
Kim et al.

(10) Patent No.: US 9,666,675 B2
(45) Date of Patent: May 30, 2017

(54) GRAPHENE DEVICE AND METHOD OF OPERATING THE SAME

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Unjeong Kim, Osan-si (KR); Younggeun Roh, Seoul (KR); Yeonsang Park, Seoul (KR); Chihun In, Seoul (KR); Hyunyong Choi, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 15/070,484

(22) Filed: Mar. 15, 2016

(65) Prior Publication Data

US 2017/0104071 A1    Apr. 13, 2017

(30) Foreign Application Priority Data

Oct. 7, 2015    (KR) ........................ 10-2015-0141049

(51) Int. Cl.
*G02F 1/00* (2006.01)
*G02F 1/03* (2006.01)
(Continued)

(52) U.S. Cl.
CPC .......... *H01L 29/1606* (2013.01); *B82Y 30/00* (2013.01); *G02F 1/015* (2013.01);
(Continued)

(58) Field of Classification Search
CPC ........ G02F 1/01; G02F 1/0102; G02F 1/0121; G02F 1/015; G02F 1/03; G02F 1/0316;
(Continued)

(56) References Cited

U.S. PATENT DOCUMENTS 8,164,089 B2 * 4/2012 Wu .................. B82Y 30/00
257/40
8,546,246 B2 * 10/2013 Lin ................. H01L 21/02378
438/197

(Continued)

FOREIGN PATENT DOCUMENTS

KR    10-2007-0120360 A    12/2007
KR    10-2014-0045628 A    4/2014

OTHER PUBLICATIONS

Jiang, et al.; "Conformal Dual-Band Near-Perfectly Absorbing Mid-Infrared Metamaterial Coating", Acsnano, vol. 5, No. 6, Apr. 2011, 7 pages total.

(Continued)

*Primary Examiner* — Loha Ben
(74) *Attorney, Agent, or Firm* — Sughrue Mion, PLLC

(57) ABSTRACT

A graphene device and a method of operating the same are provided. The graphene device includes: an active layer including a plurality of meta atoms spaced apart from each other, each of the meta atoms having a radial shape, and a graphene layer that contacts each of the plurality of meta atoms; and a dielectric layer covering the active layer.

26 Claims, 25 Drawing Sheets

(51) Int. Cl.
*H01L 29/16* (2006.01)
*H01L 29/786* (2006.01)
*H01L 29/45* (2006.01)
*G02F 1/015* (2006.01)
*B82Y 30/00* (2011.01)
*H01L 29/423* (2006.01)
*H01L 29/49* (2006.01)
*H01L 21/02* (2006.01)
*G02F 1/01* (2006.01)

(52) U.S. Cl.
CPC ........ *H01L 29/45* (2013.01); *H01L 29/78603* (2013.01); *H01L 29/78684* (2013.01); *G02F 1/0121* (2013.01); *G02F 1/0316* (2013.01); *H01L 21/02318* (2013.01); *H01L 29/42384* (2013.01); *H01L 29/4908* (2013.01)

(58) Field of Classification Search
CPC .... G02F 1/0327; G02F 1/0338; G02F 1/0558; G02F 1/061; B82Y 30/00; H01L 21/0237; H01L 21/02378; H01L 21/02367; H01L 21/02381; H01L 29/0665; H01L 29/1606; H01L 29/1608; H01L 29/42384; H01L 29/45; H01L 29/4908; H01L 29/78603; H01L 29/78684
USPC ....... 359/237, 238, 241, 245, 298, 315, 321; 257/9, 27, 29, 76, 77, E21.09, E29.005, 257/E29.082, E29.241; 438/197, 478, 438/479
See application file for complete search history.

(56) References Cited

U.S. PATENT DOCUMENTS

| | | | | |
|---|---|---|---|---|
| 8,785,911 B2* | 7/2014 | Chen | ................ | H01L 29/42384 257/29 |
| 8,816,333 B2* | 8/2014 | Babich | .............. | H01L 21/02376 257/40 |
| 8,878,193 B2* | 11/2014 | Avouris | ................ | B82Y 10/00 257/76 |
| 9,064,776 B2* | 6/2015 | Lin | .................. | H01L 21/02378 |
| 2007/0291982 A1 | 12/2007 | Sung et al. | | |
| 2012/0128370 A1 | 5/2012 | Wu et al. | | |
| 2012/0241616 A1 | 9/2012 | Axelrod et al. | | |
| 2013/0214164 A1 | 8/2013 | Zhang et al. | | |
| 2013/0314765 A1 | 11/2013 | Padilla et al. | | |

OTHER PUBLICATIONS

Yao, et al.; "Wide Wavelength Tuning of Optical Antennas on Graphene with Nanosecond Response Time", Nano Letters, vol. 14., Dec. 2013, 6 pages total.

Kim, et al.; "Electrical Control of Optical Plasmon Resonance with Graphene", Nano Letters, vol. 12, Oct. 2012, 5 pages total.

Lee, et al.; "Switching Terahertz Waves with Gate-Controlled Active Graphene Metamaterials", vol. 11, Nov. 2012, 6 pages total.

Yao, et al.; "Broad Electrical Tuning of Graphene-Loaded Plasmonic Antennas", Nano Letters, vol. 13, Feb. 2013, 8 pages total.

Communication dated Feb. 10, 2017, issued by the European Patent Office in counterpart European Application No. 16175662.2.

Seung Hoon Lee, et al., "Switching terahertz waves with gate-controlled active graphene metamaterials", Nature Materials, vol. 11, No. 11, Sep. 30, 2012, pp. 936-941, XP055341792.

Seung Hoon Lee, et al., "Ultrafast refractive index control of a terahertz graphene metamaterial", Scientific Reports, vol. 3, No. 2135, Jul. 4, 2013, pp. 1-6, XP 055341848.

Teun-Teun Kim, et al., "Gate-controlled Electromagnetically Induced Transparency Analogue in Graphene Metamaterials", 2014 Conference on Lasers and Electro-optics (CLEO)—Laser Science to Photonic Applications, The Optical Society, Jun. 8, 2014, XP032707935, Total 2 pages.

Chen Hou-Tong, "Semiconductor activated terahertz metamaterials", Frontiers of Optoelectronics, Higher Education Press, Heidelberg, vol. 8, No. 1, Aug. 2014, pp. 27-43, XP035451319.

Weiren Zhu, et al., "Wideband giant optical activity and negligible circular dichroism of near-infrared chiral metamaterial based on a complementary twisted configuration", Journal of Optics, Institute of Physics Publishing, Bristol GB, vol. 15, No. 12, Oct. 18, 2013, Total 6 pages, XP020255084.

Costas M. Soukoulis & Martin Wegener, "Past achievements and future challenges in the development of three-dimensional photonic metamaterials", Nature Photonics, vol. 5, Jul. 17, 2011, pp. 523-530, XP055342006.

* cited by examiner

GRAPHENE DEVICE AND METHOD OF OPERATING THE SAME

CROSS-REFERENCE TO RELATED APPLICATION

This application claims priority from Korean Patent Application No. 10-2015-0141049, filed on Oct. 7, 2015, in the Korean Intellectual Property Office, the disclosure of which is incorporated herein in its entirety by reference.

BACKGROUND

1. Field

Apparatuses and methods consistent with the present disclosure relate to a graphene device including a meta atom and a method of operating the graphene device.

2. Description of the Related Art

Since the discovery of graphene in the form of a graphite monoatomic layer, graphene has become popular, as a next-generation material, in many different fields due to graphene's excellent electrical and mechanical characteristics. Graphene is a material in which carbon atoms are connected in a hexagonal array in a plane and has a thickness that is a mere one layer of an atom. Graphene conducts electricity one hundred or more times faster than single crystal silicon, which is typically used as a semiconductor, and has a theoretical mobility of about 200,000 $cm^2/Vs$. It is known that graphene has a conductivity one hundred times greater than that of copper. Therefore, research into the use of graphene as a basic material of an electronic circuit has increased.

Currently, researchers are working on a device including graphene.

SUMMARY

One or more exemplary embodiments may provide graphene devices including meta atoms, graphene devices that filter incident light, graphene devices that modulate incident light, and methods of manufacturing graphene devices.

Additional exemplary aspects will be set forth in part in the description which follows and, in part, will be apparent from the description, or may be learned by practice of the presented exemplary embodiments.

According to an aspect of an exemplary embodiment, a graphene device includes: a substrate; an active layer disposed on the substrate and including a plurality of meta atoms spaced apart from each other and each having a radial shape in which a second branch of the meta atom intersects a first branch of the meta atom, and a graphene layer that contacts each of the plurality of meta atoms; and a dielectric layer disposed on the substrate and covering the active layer.

At least one of the plurality of meta atoms may include first and second sub-meta atoms that share a partial region.

At least one of the first and second sub-meta atoms may have a bar shape.

At least one of the first and second sub-meta atoms may be symmetric with respect to the partial region.

The first and second sub-meta atoms may be symmetric with respect to an axis passing through the partial region.

At least one of the first and second sub-meta atoms may have a length which is shorter than a wavelength of light in a mid-infrared band.

At least one of the first and second sub-meta atoms may have a length of about 1 to about 10 µm.

The first sub-meta atom may have a thickness which is less than a length of the first sub-meta atom.

The meta atom may have a thickness of about 50 to about 300 nm.

The plurality of meta atoms may be arranged in a two-dimensional (2D) lattice array.

At least one of the plurality of meta atoms may include metal.

The metal may include gold.

The dielectric layer may have a dielectric constant greater than a dielectric constant of the graphene layer.

The dielectric layer may include an ion gel.

Each of the plurality of meta atoms may contact the substrate, and the graphene layer may cover the plurality of meta atoms on the substrate.

The graphene layer may contact the substrate, and each of the plurality of meta atoms may contact the graphene layer.

The substrate may be an insulating substrate.

The substrate may be a sapphire substrate.

The graphene device may further include: a first electrode disposed on the substrate and contacting the dielectric layer.

A dielectric constant of the graphene layer may be dependent on a voltage applied to the first electrode.

Light incident on the graphene device may induce a current at an interface between the graphene layer and the meta atom.

The induced current may reflect light in a specific wavelength band.

The wavelength of the light in the specific wavelength band may depend on a dielectric constant of the graphene layer.

The incident light may include light in a mid-infrared band.

The graphene device may further include: a second electrode and a third electrode disposed on the substrate and spaced apart from each other with the first electrode disposed therebetween.

Each of the second and third electrodes may contact the active layer.

According to an aspect of another exemplary embodiment, a method of operating a graphene device including a plurality of meta atoms spaced apart from each other and having a radial shape in which a first branch of the meta atom intersects a second branch thereof, and a graphene layer contacting each of the plurality of meta atoms includes: allowing first light to be incident on the graphene device; and reflecting second light in a wavelength band corresponding to a dielectric constant of the graphene layer.

The wavelength band of the second light may be proportional to a dielectric constant of the graphene layer.

The first light may include light in a mid-infrared band.

The method may further include: allowing third light to be incident on the graphene device, wherein the second light may have an energy that depends on the third light.

The third light may include an optical-pump pulse.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

As the terms used herein, so far as possible, widely-used general terms are selected in consideration of functions in the inventive concept; however, these terms may vary according to the intentions of those of ordinary skill in the art, the precedents, or the appearance of new technology. Also, in some cases, there may be terms that are arbitrarily selected by the Applicant, and the meanings thereof will be described in detail in the corresponding portions of the description of the inventive concept. Therefore, the terms used herein are not simple titles of terms and should be defined based on the meanings thereof and the overall description of the inventive concept.

The terms "configure" and/or "comprise" used herein should not be construed as necessarily including all components or operations described in the specification, but should be construed as not including some components or operations or further including additional components or operations.

Hereinafter, embodiments provided for exemplary purpose only are described below with reference to the accompanying drawings. Exemplary embodiments below are provided for only implementation of the inventive concept and should not be construed as limiting the scope of the inventive concept, and things that are easily inferred from the detailed description and exemplary embodiments by a person of ordinary skill in the art should be construed as belonging to the scope of exemplary embodiments.

Figure 1:
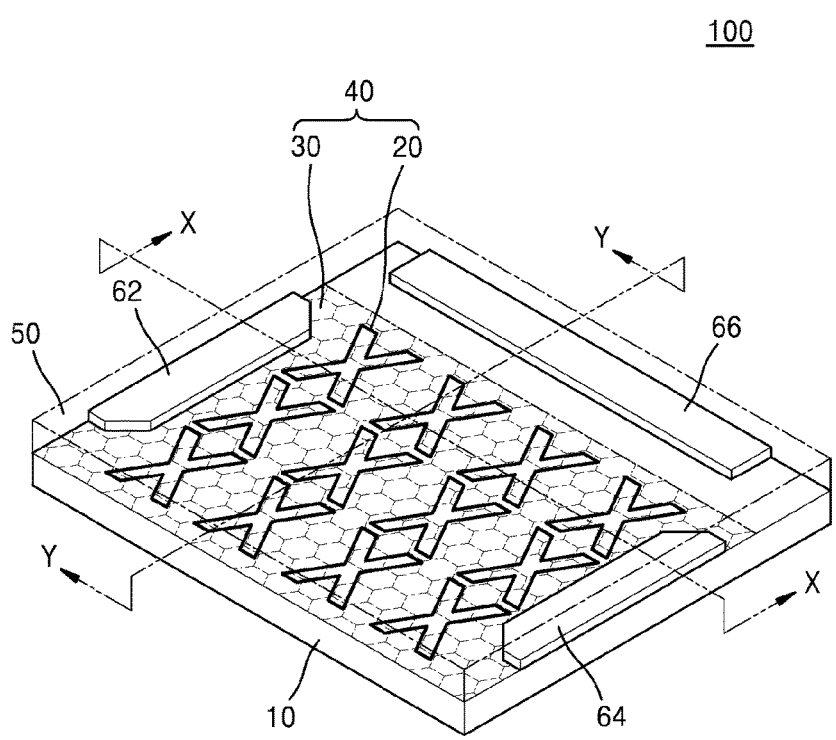
FIG. 1 is a perspective view illustrating a graphene device according to an exemplary embodiment.
Figure 2:
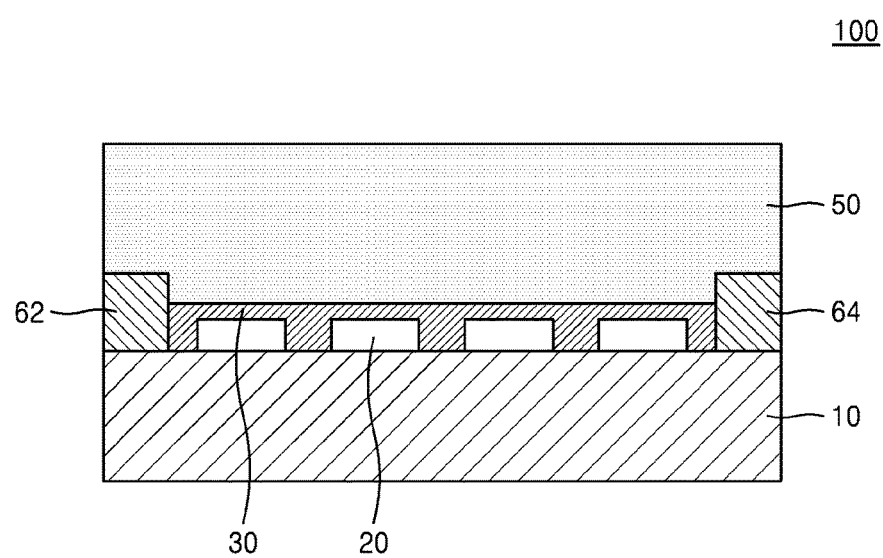
FIG. 2 is a cross-sectional view taken along X-X of FIG. 1.
Figure 3:
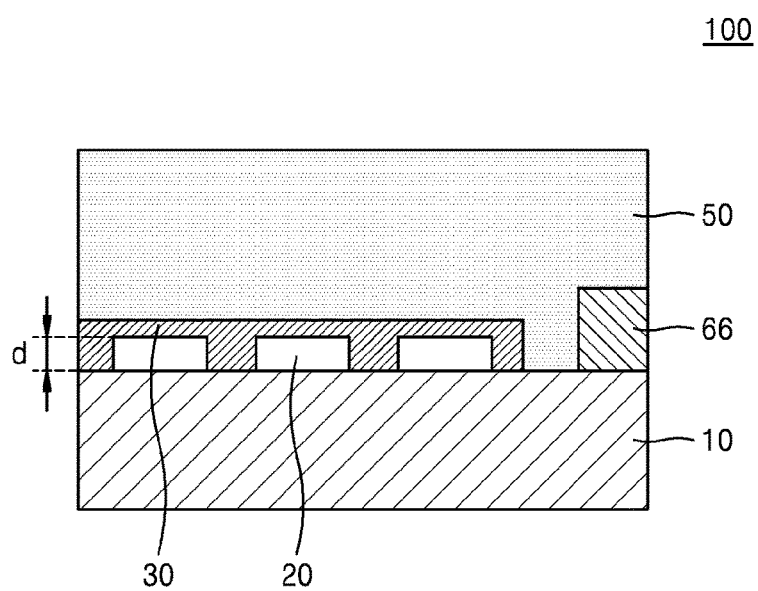
FIG. 3 is a cross-sectional view taken along Y-Y of FIG. 1.
Figure 4:
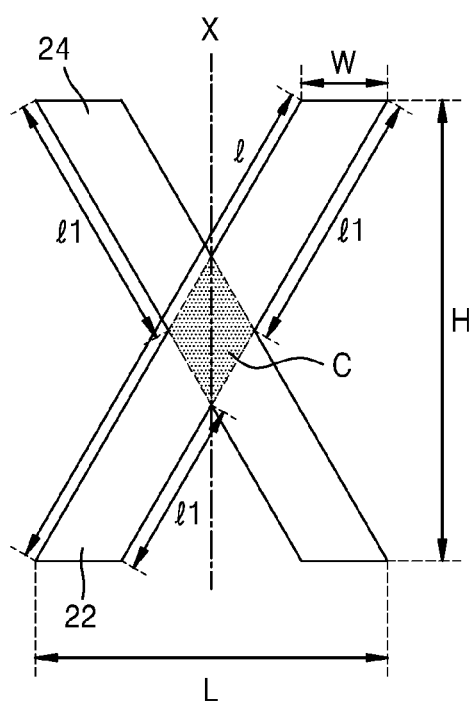
FIG. 4 is an enlarged view illustrating a meta atom illustrated in FIG. 1.

FIG. 1 is a perspective view illustrating a graphene device 100 according to an exemplary embodiment, FIG. 2 is a cross-sectional view taken along X-X of FIG. 1, FIG. 3 is a cross-sectional view taken along Y-Y of FIG. 1, and FIG. 4 is an enlarged view illustrating a meta atom 20 illustrated in FIG. 1.

As illustrated in FIGS. 1 to 4, the graphene device 100 may include a substrate 10, a plurality of meta atoms 20 spaced apart from each other and having a radial shape, a graphene layer 30 disposed on the substrate 10 and covering the plurality of meta atoms 20, and a dielectric layer 50 disposed on the graphene layer 30. The dielectric layer may cover all or a portion of the graphene layer.

The substrate 10 may include an insulating material having a large band gap. The insulating material may be selected depending on a function to be performed by the graphene device 100. For example, in a case in which the graphene device 100 is to operate as a filter or a switching device, the substrate 10 may include a plastic material. In this case, the plastic material forming the substrate 10 may be one or more organic materials.

Also, in the case in which the graphene device 100 is to operate as an optical modulator that modulates light and is controlled according to control light incident thereon, the substrate 10 may include a material having a band gap larger than the energy of the control light. When the band gap of the substrate 10 is larger than the energy of the control light, a reaction between the substrate 10 and the control light does not occur. The substrate 10 may be a sapphire substrate having a large energy band gap.

The plurality of meta atoms 20 may be spaced apart from each other on the substrate 10. The plurality of meta atoms 20 may be arranged in a lattice configuration. FIG. 1 illustrates the plurality of meta atoms 20 are arranged in a two dimensional lattice configuration. The plurality of meta atoms 20 are not limited thereto and may be arranged in one dimension. The plurality of meta atoms 20 may be referred to, collectively, as a meta material.

Each meta atom 20 may be a material patterned and structured into a predetermined size. Each meta atom 20 may have a size less than a wavelength of light in a visible light band, and may have an arbitrary refractive index not existing in the natural world with respect to an electromagnetic wave or a sound wave. The meta atoms 20, included in the graphene device 100 according to an exemplary embodiment, may reflect specific light from among light incident thereon.

Each meta atom 20 may have a radial shape with branches extending outward from a specific point. FIG. 4 illustrates an X-shaped meta atom 20. The size of the meta atom 20 and the intervals between the meta atoms 20 may be determined by a wavelength, etc. of light to be incident on the meta atoms 20. In a case in which the incident light is mid-infrared light, the size of each of the meta atoms 20 may be less than the wavelength of the mid-infrared light. For example, the horizontal length L and the vertical length H of each meta atom 20, as shown in FIG. 4, for example, may be about several μm, and the intervals between the meta atoms 20 may be about several hundred nm or less. For example, in a case in which the wavelength of incident light is about 3 to 5 μm, the horizontal length L and the vertical length H of each meta atom 20 may be about 2.2 μm and about 3.6 μm, respectively, the thickness "d" of each meta atom 20 may be about 200 nm, and the intervals between the meta atoms 20 may be about 400 nm.

Each meta atom 20 may include a first sub-meta atom 22 and a second sub-meta atom 24 that share a partial region C, as shown in FIG. 4. Each of the first and second sub-meta atoms 22 and 24 may have a bar shape having a width narrower than a length thereof. The thickness "d" of each of the first and second sub-meta atoms 22 and 24 may be less than the length "l" of each of the first and second sub-meta atoms 22 and 24. The length "l", the width "w", and the thickness "d" of each of the first and second sub-meta atoms 22 and 24 may be determined by the wavelength of incident light. For example, in a case in which the incident light is mid-infrared light, the length "l", the width "w", and the thickness "d" of each of the sub-meta atoms 22 and 24 may be less than the wavelength of the mid-infrared light. Specifically, the thickness "d" of each of the first and second sub-meta atoms 22 and 24 may be in a range from about 50 to about 300 nm, the length "l" of each of the first and second sub-meta atoms 22 and 24 may be in a range from about 1 µm to about 10 µm, and the width "w" of each of the first and second sub-meta atoms 22 and 24 may be in a range from about 50 nm to about 300 nm. For example, the width "w" of each of the first and second sub-meta atoms 22 and 24 may be about 200 nm.

Each of the first and second sub-meta atoms 22 and 24 may be symmetric with respect to a partial region C. The partial region C may be the central region of each of the first and second sub-meta atoms 22 and 24. Therefore, each of the first and second sub-meta atoms 22 and 24 may be symmetric with respect to the partial region C. Furthermore, the first sub-meta atom 22 may be symmetric with the second sub-meta atom 24 with respect to the partial region C. For example, the first sub-meta atom 22 may be symmetric with the second sub-meta atom 24 with respect to a first axis X passing through the partial region C.

The meta atom 20 may include metal including a free electron. For example, the meta atom 20 may include gold. As understood by a person of ordinary skill in the art, the meta atom 20 may include other metals including many free electrons besides gold.

The graphene layer 30 is disposed on the substrate 10 and covers the plurality of meta atoms 20. The graphene forming the graphene layer 30 is a material that is very stable structurally and chemically, and has an excellent light absorption characteristic, excellent efficiency of converting light to heat, and excellent heat transfer characteristics. The graphene layer 30 may be formed by transferring graphene, manufactured by using chemical vapor deposition (CVD), onto the substrate 10, and then patterning the graphene. Alternatively, the graphene may be formed in a thin film by chemical exfoliation from graphite.

The graphene layer 30 may contact each of the plurality of meta atoms 20. When light is incident on the graphene device 100 according to an exemplary embodiment, a current is generated at the interface between the meta atoms 20 and the graphene layer 30, and a current having a specific wavelength resonates on the interface between the meta atoms 20 and the graphene layer 30. Therefore, the graphene layer 30 may reflect light having the same wavelength as the wavelength of the resonating current from among the incident light. The layer including the meta atoms 20 and the graphene layer 30 may be referred to as an active layer 40.

The graphene device 100 may further include a dielectric layer 50 that covers the graphene layer 30. A gate voltage may be used to accumulate charges on the graphene layer 30, as described below. To increase the charge accumulation in the graphene layer 30, the dielectric layer 50 may have a dielectric constant greater than a dielectric constant of the graphene layer 30. For example, the dielectric layer 50 may include an ion-gel, and the ion-gel may be a polymer gel including ions.

The graphene device 100 may further include one or more electrodes to which an electric signal may be applied. For example, the graphene device 100 may further include first through third electrodes 62, 64, and 66, which may be spaced apart from each other, as shown. The first through third electrodes 62, 64, and 66 may each include a conductive material. For example, the first through third electrodes 62, 64, and 66 may each include a metallic material or a conductive oxide.

The first through third electrodes 62, 64, and 66 may be spaced apart from each other on the same plane. The first through third electrodes 62, 64, and 66 may be a drain electrode, a source electrode, and a gate electrode, respectively. Hereinafter, the first electrode 62 is referred to as the drain electrode, the second electrode 64 is referred to as the source electrode, and the third electrode 66 is referred to as the gate electrode.

Each of the drain electrode 62 and the source electrode 64 may contact the active layer 40, for example, the graphene layer 30, and the gate electrode 66 may be spaced apart from the active layer 40 with the dielectric layer 50 disposed therebetween. That is, the gate electrode 66 may contact the dielectric layer 50.

Figure 5A:
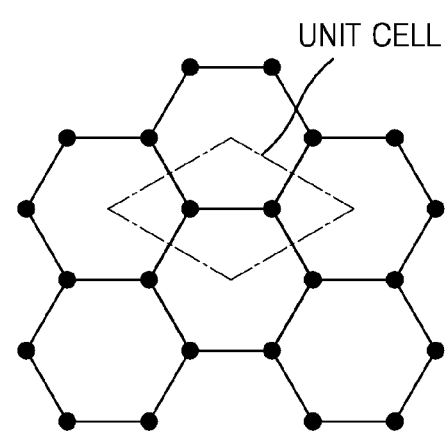
FIG. 5A is a conceptual view illustrating a carbon atom arrangement of graphene.
Figure 5B:
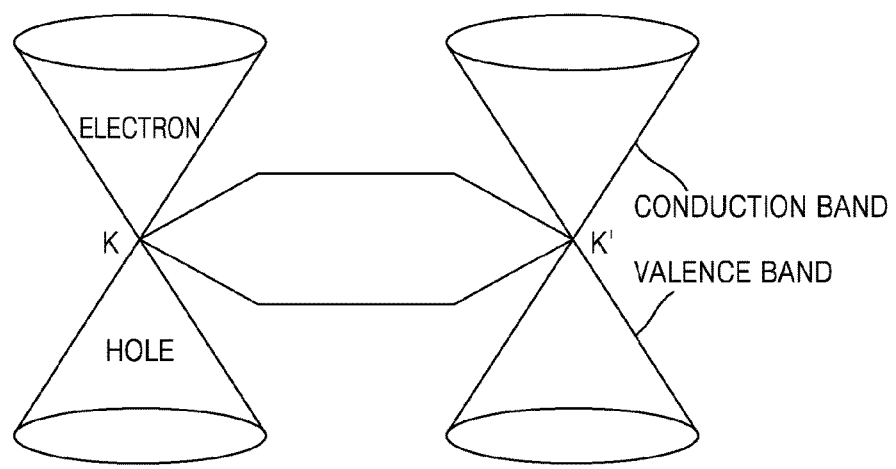
FIG. 5B is a diagram illustrating an energy band structure in the vicinity of a Fermi level of graphene.

When a voltage is applied to the gate electrode 66, a Fermi level of the graphene layer 30 may change depending on the applied voltage. FIGS. 5A and 5B illustrate a conceptual view of carbon atom arrangement of graphene and an energy band structure in the vicinity of a Fermi level, respectively.

Referring to FIG. 5A, graphene has a honeycomb-shaped structure in which a carbon atom is located at each vertex of each hexagon. An energy band structure of a unit cell including two adjacent carbon atoms, as illustrated in FIG. 5A, is illustrated in FIG. 5B.

Referring to FIG. 5B, in the energy band structure of graphene, a conduction band and a valence band meet at each valley of a Brillouin zone having a hexagonal structure in a k-space, and form a conic shape at the vicinity of a Fermi level. The energy of charges is in proportion to momentum in the vicinity of the Fermi level, which becomes similar to the dispersion relation of a photon having zero mass. This denotes that the effective mass of an electron inside graphene becomes zero, and denotes that a carrier inside graphene may move at very high speeds (a Fermi speed which is about 1/300 of the speed of light). It is known that the mobility of a carrier inside graphene has a high value of about 20,000 to about 200,000 $cm^2/Vs$. Therefore, graphene is applicable to a high speed switching device.

Figure 6:
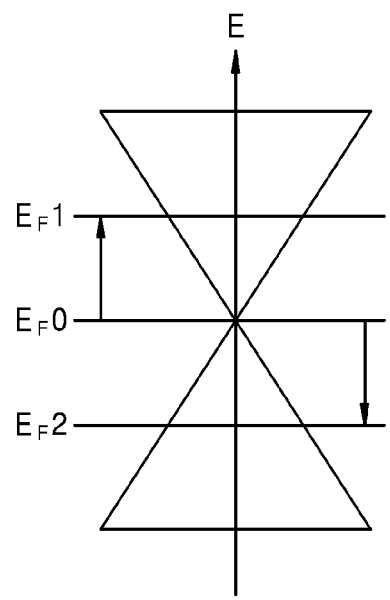
FIG. 6 is a diagram illustrating an energy change of graphene depending on a gate voltage according to an exemplary embodiment.

FIG. 6 is a diagram illustrating an energy change of graphene depending on a gate voltage according to an exemplary embodiment. Referring to FIG. 6, when a positive (+) voltage is applied to the gate electrode 66, the Fermi level of graphene is raised from $E_F0$ to $E_F1$, which is a conduction band side, and thus a number of conductible electrons increases. In contrast, when a negative (−) voltage is applied to the gate electrode 66, the Fermi level of graphene is lowered from $E_F0$ to $E_F2$, which is a valence band side, and thus a number of holes increases. That is, the charge induced in the graphene may be determined, and the Fermi level inside the graphene may be moved depending on the voltage applied to the gate electrode. Particularly, in a case in which a voltage applied to the gate electrode is a negative voltage, the dielectric characteristics of graphene may be reinforced.

Specifically, the Fermi level of graphene is adjusted by a gate voltage, and when the Fermi level of the graphene is adjusted, the dielectric constant of the graphene may change as in Equation 1 below.

Equation 1:

$$\varepsilon(E) = 1 + \frac{e^2}{8\pi E \varepsilon_0 d} \ln \frac{(E + 2|E_F|)^2 + \Gamma^2}{(E - 2|E_F|)^2 + \Gamma^2} - \frac{e^2}{\pi \varepsilon_0 d} \frac{|E_F|}{E^2}$$

where $\varepsilon_0$ is a dielectric constant, E is an energy level of graphene, $E_F$ is the Fermi level of graphene, "d" is the thickness of graphene, "e" is the charge of an electron, and $\Gamma$ is interband transition broadening.

From Equation 1, it is shown that when the Fermi level of graphene moves toward a valence band, the dielectric constant of the graphene increases. Therefore, when the magnitude of a negative gate voltage applied to the graphene increases, the dielectric constant of the graphene may increase.

The graphene device 100 according to an exemplary embodiment may operate as a filter that reflects light of a specific wavelength from among incident light by using this change in the dielectric constant. Also, the specific wavelength of reflected light may be adjusted depending on the magnitude of the gate voltage.

Figure 7:
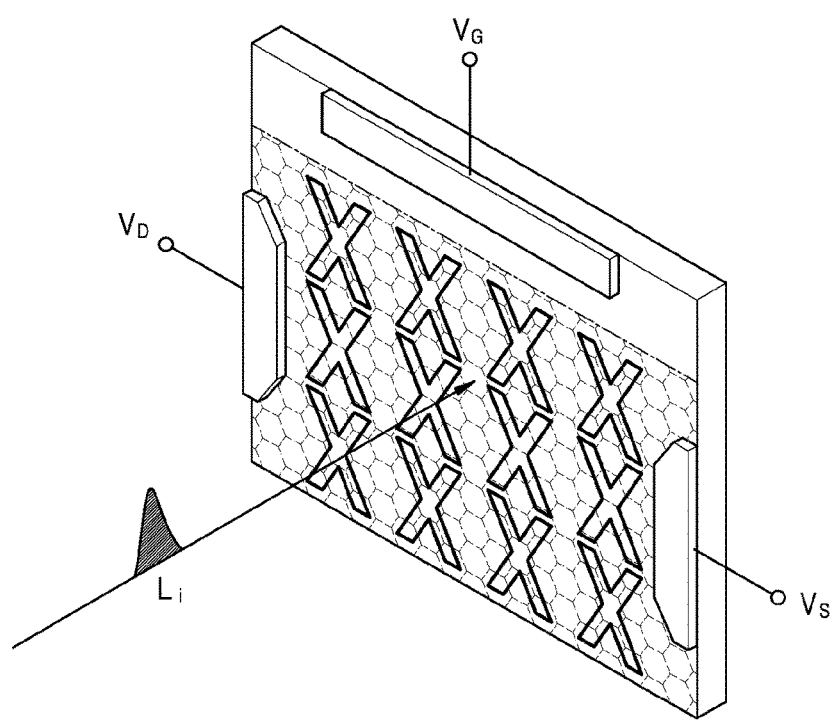
FIG. 7 is a view for explaining a graphene device that operates as a filter according to an exemplary embodiment.

FIG. 7 is a view for explaining a graphene device 100 that operates as a filter according to an exemplary embodiment. Referring to FIG. 7, when a specific voltage is applied to the gate electrode 66 of the graphene device 100, the hole or electron concentration of the graphene layer 30 increases and thus the Fermi level of the graphene may change and the dielectric constant of the graphene layer 30 may change depending on the Fermi level.

The dielectric constant of the graphene layer 30 may increase when the magnitude of the negative gate voltage increases. Also, an increase in the dielectric constant of the graphene layer 30 may increase the capacitance of the active layer 40.

First light Li, which is incident light, may be incident on the graphene device 100. The first light Li may be incident on the active layer 40 via the dielectric layer 50. The first light Li may be, for example, light in a mid-infrared band.

When the first light Li is incident on the active layer 40, imbalance between electrons and holes occurs at the interface between the graphene layer 30 and the meta atoms 20, and a current occurs due to the imbalance between the electrons and the holes.

Figure 8:
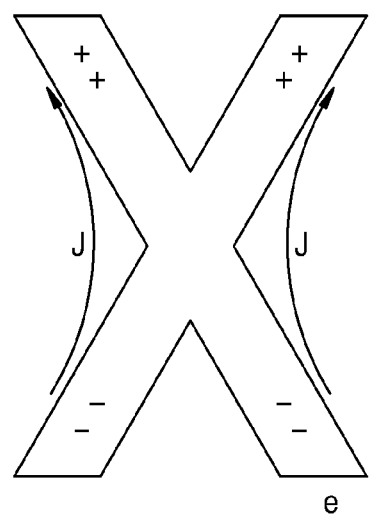
FIG. 8 is a diagram illustrating an example in which electrons and holes are in an unbalanced state at an interface between a graphene layer and a meta atom.

FIG. 8 is a diagram illustrating an example in which electrons and holes are in an imbalanced state at the interface between the graphene layer 30 and the meta atoms 20. As illustrated in FIG. 8, a current J may occur the interface between the graphene layer 30 and the meta atoms 20 due to the imbalance between electrons and holes. The current J may flow along the interface between the meta atoms 20 and the graphene.

The inductance inside the active layer 40 may lead the current, and the capacitance inside the active layer 40 may lag the current. A current in which induction and delay cancel each other, from among currents that may resonate at the interface between the meta material and the graphene layer 30, and reflect light having the same wavelength as a resonance wavelength. Also, since the resonance wavelength is in proportion to the dielectric constant of the graphene 30, when the magnitude of the negative gate voltage is large, the wavelength of the reflected light may be large.

Whether the graphene device 100 operates as a filter according to an exemplary embodiment has been determined by using high frequency structure simulation (HFSS). The horizontal length, vertical length, and thickness of each meta atom 20 have been set to about 2.2 µm, 3.6 µm, and 200 nm, respectively, and the interval between the meta atoms 20 has been set to about 400 nm.

Figure 9A:
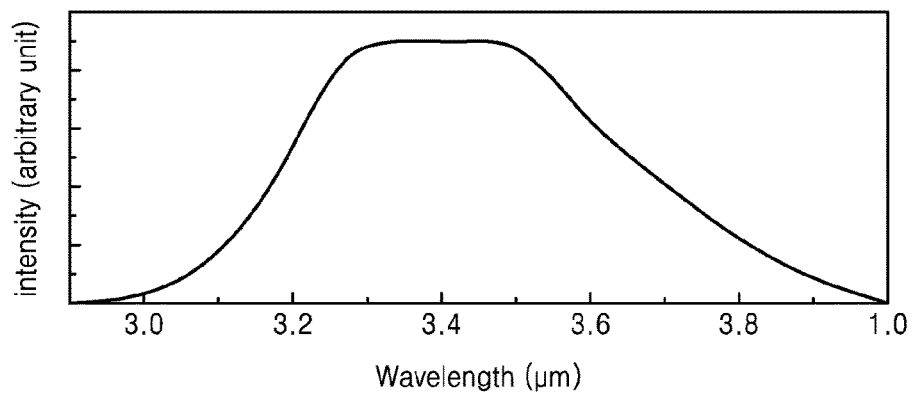
FIG. 9A is a graph illustrating a wavelength band of light incident to a graphene device according to an exemplary embodiment.
Figure 9B:
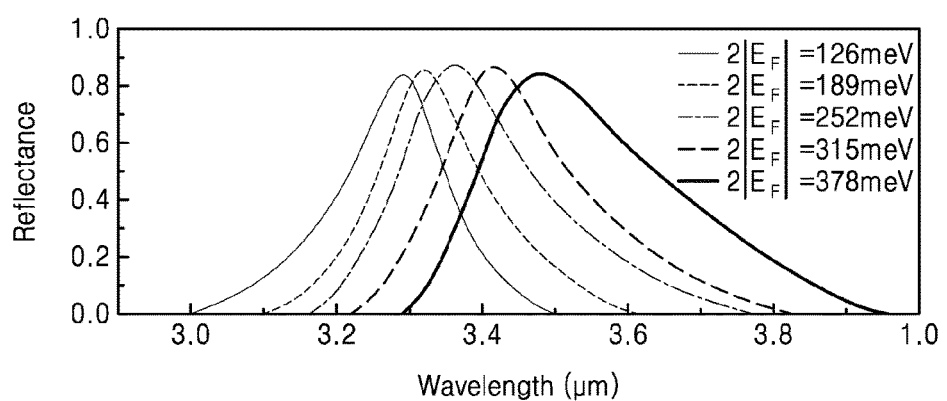
FIG. 9B is a graph illustrating a wavelength band of light reflected by a graphene device according to an exemplary embodiment.

FIG. 9A is a graph illustrating a wavelength band of light incident onto a graphene device 100 according to an exemplary embodiment. For incident light illustrated in FIG. 9A, mid-infrared light ranging from about 3 to about 5 µm is used. FIG. 9B is a graph illustrating a wavelength band of light reflected by the graphene device 100 according to an exemplary embodiment. As illustrated in FIG. 9B, it is shown that when the Fermi level of graphene is lowered, the central wavelength of reflected light increases. The Fermi level is in proportion to the magnitude of the negative gate voltage. Therefore, it is shown that, in the graphene device 100 according to an exemplary embodiment, the wavelength of reflected light may be selected by adjusting the magnitude of the gate voltage.

Figure 10:
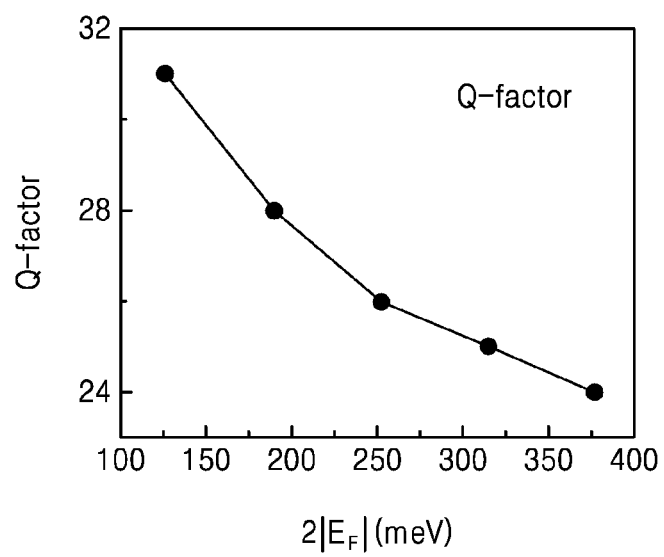
FIG. 10 is a graph illustrating a Q-factor of a graphene device according to an exemplary embodiment.

FIG. 10 is a graph illustrating a Q-factor of a graphene device 100 according to an exemplary embodiment. As illustrated in FIG. 10, it is revealed that even when the Fermi level of graphene changes, a high efficiency having a Q-factor of about 20 or more is achieved.

When light that uses an electric pulse is modulated, the modulation speed may be determined by a cut-off frequency of the gate electrode 66. An information transfer speed of a commercialized infrared communication apparatus that uses an electric pulse may be about 1 kHz to about 100 MHz.

A speed at which an electron having optical energy inside graphene emits the optical energy is about 1 ps. This is about 1000 times faster than a commonly known semiconductor material, for example, GaAs or Ge. The graphene device 100 according to an exemplary embodiment may modulate light at high speeds by taking advantage of the fast energy emitting speed of graphene. Since a switching speed of graphene is about several ps, light modulation that uses control light is faster than light modulation that uses an electric signal and thus may increase an information transfer speed. The control light may be an optical pump pulse.

In a case in which a graphene device 100 according to an exemplary embodiment is used as a high speed optical modulator, the substrate 10 may include a material having a band gap greater than the energy of control light. The substrate 10 may be an insulating substrate, and a sapphire substrate.

For example, in a case in which the substrate 10 is a silicon substrate, since silicon is a semiconductor material having an indirect bandgap, an optical energy emitting speed of an electron inside the silicon is about 1 µs. Since the optical energy emitting speed of the silicon is much slower than the optical energy emitting speed of graphene, the slow modulation speed of silicon has a greater influence on the light modulation speed than the fast modulation speed of graphene. Therefore, a graphene device 100 according to an exemplary embodiment, may be formed on an insulating material having a high energy bandgap.

Figure 11:
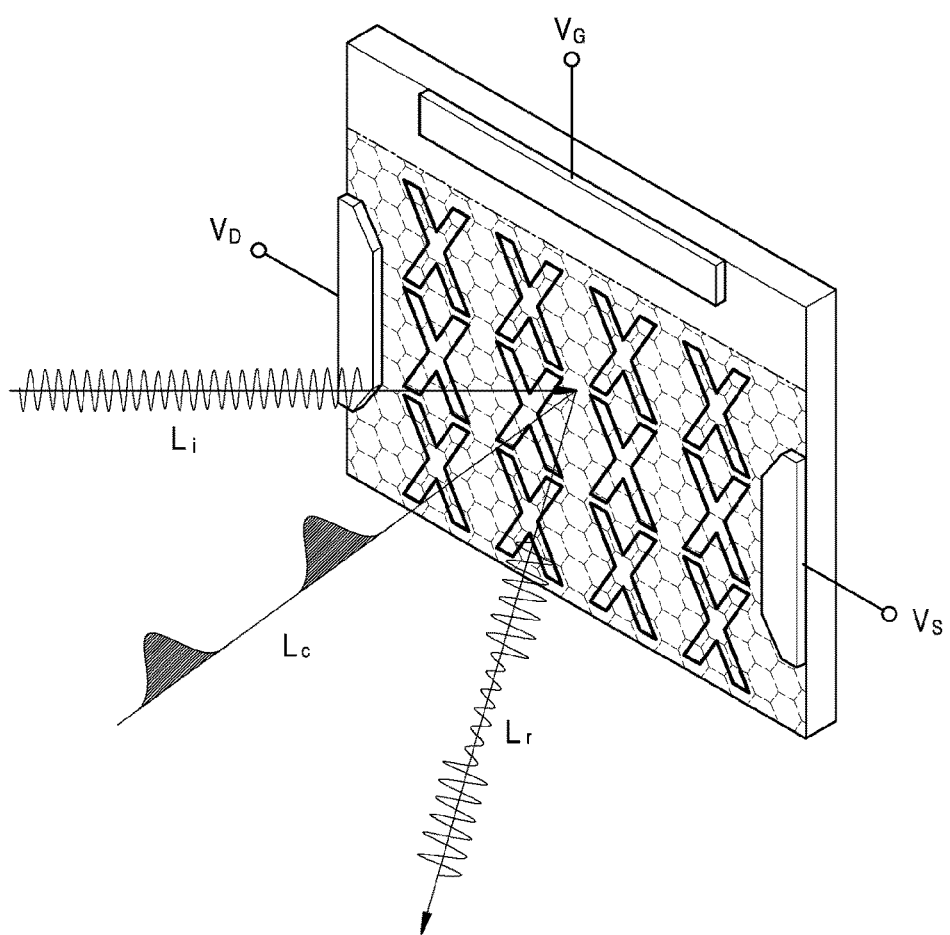
FIG. 11 is a view illustrating a graphene device that may modulate light by using control light according to an exemplary embodiment.

FIG. 11 is a view illustrating a graphene device 100 that may modulate light by using control light according to an exemplary embodiment. Referring to FIG. 11, when first light Li, which is a modulation object, is incident, second light Lr, which is light of a specific wavelength from among the first light Li, may be reflected under control of a gate voltage. The specific wavelength of the reflected light may change depending on the magnitude of the gate voltage.

Also, third light Lc may be incident on the graphene device 100 of FIG. 11. The third light Lc may be a pulse type as control light. The third light Lc may be an optical-pump pulse. Since the optical energy emitting speed of graphene is about 1 ps, the third light Lc may be a femto-second optical pulse.

Light excitation of an electron inside graphene by an optical pump raises the temperature of the graphene, and increases the resistance of the graphene. Light emission of an electron inside graphene by an optical pump lowers the temperature of the graphene, and reduces a resistance of the graphene. Since the temperature change of the graphene is very fast, several pico seconds, the graphene device 100 according to an exemplary embodiment may modulate incident light by using control light.

Figure 12A:
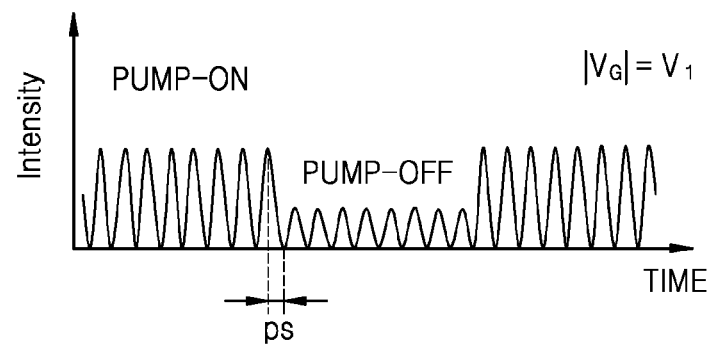
FIGS. 12A and 12B are views for explaining waves reflected by a graphene device depending on a gate voltage according to an exemplary embodiment.
Figure 12B:
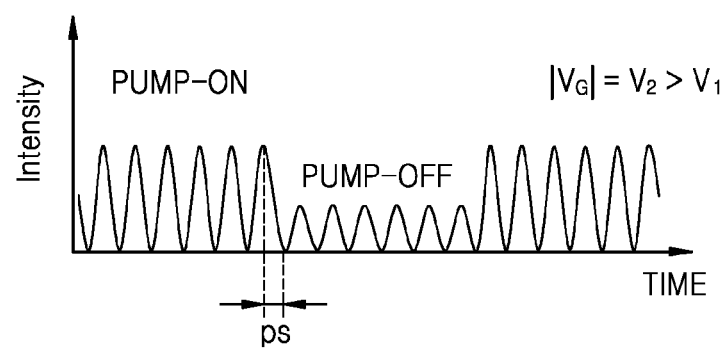

Furthermore, as understood by a person of ordinary skill in the art, a graphene device 100 according to an exemplary embodiment may adjust the wavelength band of the second light depending on the gate voltage, and reflect the second light in any of various wavelength bands. Therefore, information may be provided to various kinds of apparatuses by using one graphene device 100. FIGS. 12A and 12B are views for explaining waves reflected by the graphene device 100 depending on a gate voltage according to an exemplary embodiment. As illustrated in FIGS. 12A and 12B, when control light is used, the intensity of the second light may change depending on the pump-on or pump-off state of the control light at a switching speed of several pico seconds. Also, the wavelength of the second light may be adjusted depending on the magnitude of the gate voltage. To make the wavelength of the second light illustrated in FIG. 12B greater than the wavelength of the second light illustrated in FIG. 12A, the magnitude of the negative gate voltage may be increased.

As described above, in a case in which the graphene device 100 is used as a modulator that reflects specific light, the drain electrode 62 and the source electrode 64 of the graphene device 100 illustrated in FIG. 1 are not essential components. Therefore, the drain electrode 62 and the source electrode 64 may be omitted from the graphene device 100 operating as a modulator.

The graphene device 100 according to an exemplary embodiment may be used as a switching device. For example, a current flow between the drain electrode 62 and the source electrode 64 may be controlled by adjusting the magnitude of a voltage of the gate electrode 66 with a predetermined voltage applied to the drain electrode 62 and the source electrode 64. FIGS. 13 to 16B are views for explaining a method of manufacturing a graphene device according to an exemplary embodiment.

Figure 13:
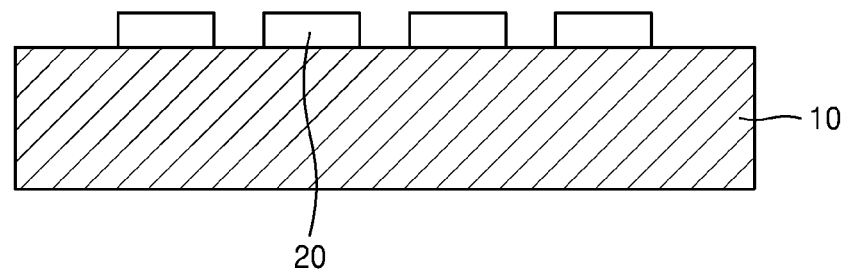
FIGS. 13 to 16B are views for explaining a method of manufacturing a graphene device according to an exemplary embodiment.

As illustrated in FIG. 13, the plurality of meta atoms 20 may be patterned on the substrate 10. The plurality of meta atoms 20 may be spaced apart from each other and arranged in a lattice configuration. At least one of the plurality of meta atoms 20 may have a radial shape. The plurality of meta atoms 20 may be formed on the substrate 10 by using an electron beam lithography method. The meta atom may include metal.

Figure 14:
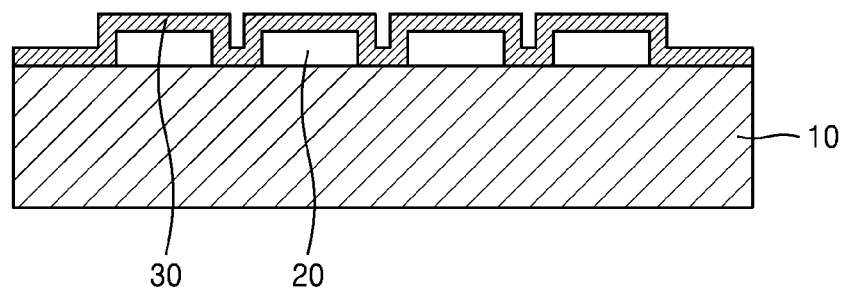

Also, as illustrated in FIG. 14, the graphene layer 30 that covers the plurality of meta atoms 20 may be formed on the substrate 10. The graphene layer 30 may be synthesized by using chemical vapor deposition (CVD), and the synthesized graphene layer 30 may be transferred.

A process of synthesizing graphene by using the CVD is described below.

First, a silicon wafer having a silicon oxide layer ($SiO_2$) (alternately, various insulating substrates may be used) is prepared. Subsequently, a metal catalyst layer is formed by depositing metal catalysts, such as Ni, Cu, Al, and Fe, on the prepared silicon layer ($SiO_2$) by using a sputtering unit, an e-beam evaporator, etc.

Next, the silicon wafer on which the metal catalyst layer has been formed, and a gas including carbon ($CH_4$, $C_2H_2$, $C_2H_4$, CO, etc.) are inserted into a reactor for thermal chemical vapor deposition or inductive coupled plasma chemical vapor deposition (ICP-CVD) and are heated to allow carbon to be absorbed into the metal catalyst layer. Subsequently, graphene is grown by rapidly performing cooling, separating carbon from the metal catalyst layer, and crystallizing the carbon.

Alternately, the graphene layer 30 may be formed by using a micro-mechanical method, CVD, etc. The micro-mechanical method pastes an adhesive tape on a graphite test piece, peels off the adhesive tape, and thereby obtains graphene on the surface of the adhesive tape separated from the graphite. According to a SiC crystalline pyrolysis method, when a single crystal of SiC is heated, the SiC on the surface decomposes, the Si is removed, and graphene is generated by the remaining carbon component. The forming of the graphene layer 30 is not limited to one of the above-described graphene synthesis methods, and the graphene layer 30 may be formed by using any of various other methods.

Figure 15A:
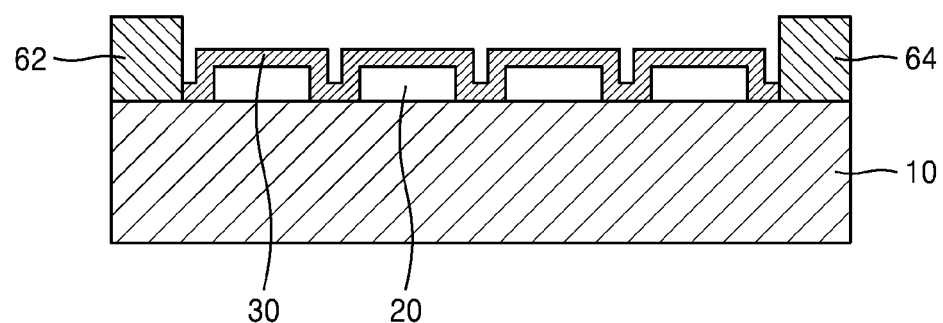
Figure 15B:
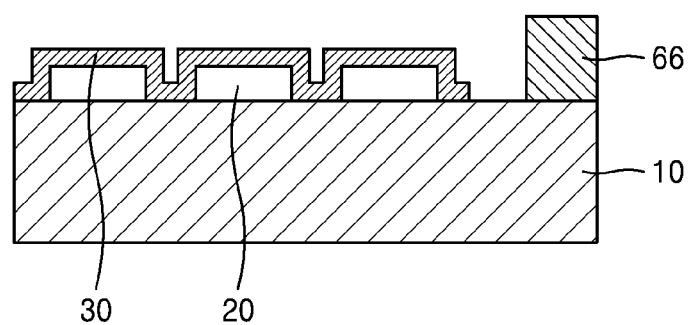

As illustrated in FIGS. 15A and 15B, the drain electrode 62, the source electrode 64, and the gate electrode 66 may be formed on the substrate 10. The drain electrode 62, the source electrode 64, and the gate electrode 66 may be spaced apart from each other. For example, the drain electrode 62, the source electrode 64, and the gate electrode 66 may each contact the substrate 10. The drain electrode 62 and the source electrode 64 may be separated from each other, and the gate electrode 66 may be disposed between the drain electrode 62 and the source electrode 64. The drain electrode 62 and the source electrode 64 may each contact the graphene layer 30. The gate electrode 66 may be spaced apart from the graphene layer 30 with the dielectric layer 50 disposed therebetween.

The drain electrode 62, the source electrode 64, and the gate electrode 66 may be formed by using deposition methods such as plasma enhanced CVD (PECVD), low pressure CVD (LPCVD), physical vapor deposition (PVD), sputtering, and atomic layer deposition (ALD). The drain electrode 62 may be used as a source electrode, and the source electrode 64 may be used as a drain electrode.

Figure 16A:
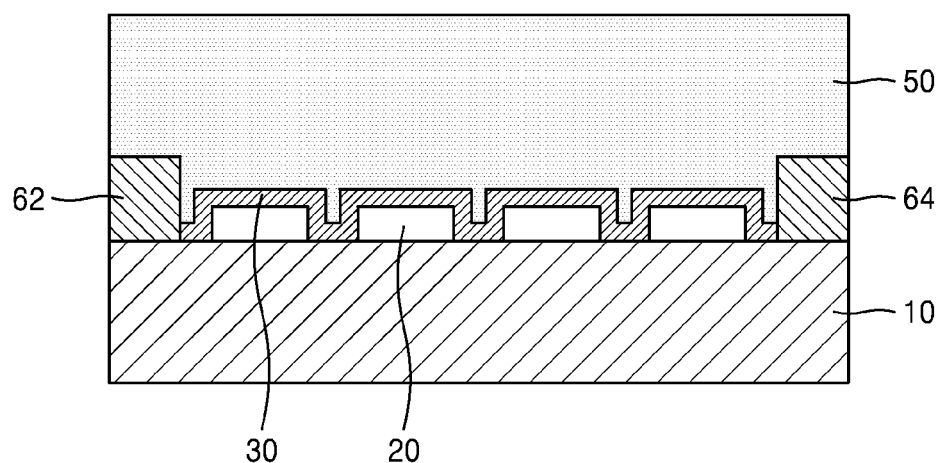
Figure 16B:
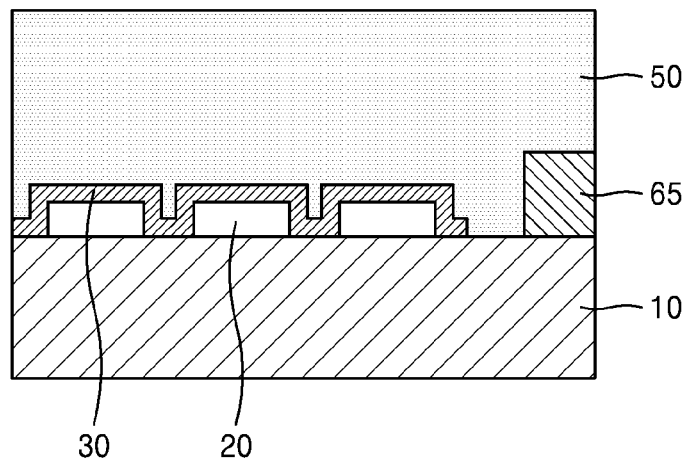

As illustrated in FIGS. 16A and 16B, the dielectric layer 50 that covers the graphene layer 30 may be formed. The dielectric layer 50 may cover at least a portion of the drain electrode 62, the source electrode 64, and the gate electrode 66. The dielectric layer 50 may separate the graphene layer 30 from the gate electrode 66 by filling a space between the graphene layer 30 and the gate electrode 66. Accordingly, the dielectric layer 50 may serve as the dielectric layer 50 of the gate electrode 66. The dielectric layer 50 may include an ion-gel.

Figure 17:
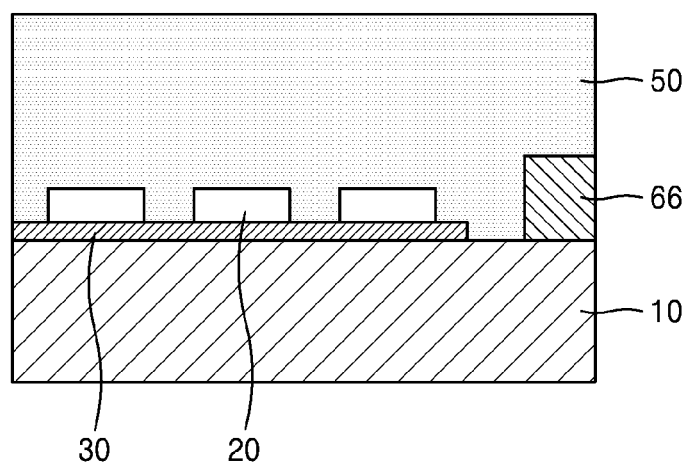
FIG. 17 is a view illustrating a graphene device according to an exemplary embodiment.

FIG. 17 illustrates a graphene device 100a according to an exemplary embodiment. When the graphene device 100a of FIG. 17 is compared with the graphene device 100 of FIG. 1, in the graphene device 100a of FIG. 17, the graphene layer 30 is disposed on the substrate 10, the plurality of metal atoms 20 are spaced apart from each other on the graphene layer 30, and the dielectric layer 50 may cover the plurality of meta atoms 20 on the graphene layer 30. Since current resonance occurs at the interface between the graphene layer 30 and the meta atoms 20, the stacking order of the graphene layer 30 and the meta atoms 20 may be changed.

Figure 18:
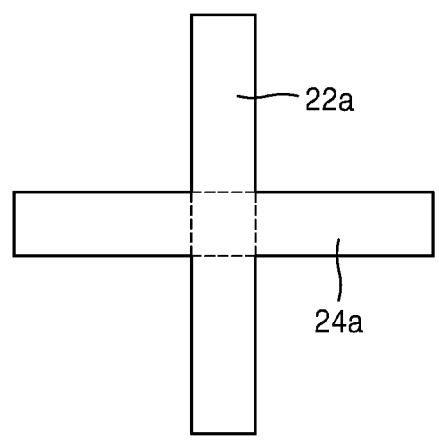
FIGS. 18 to 20 are views illustrating an example of a meta atom applicable to a graphene device according to an exemplary embodiment.
Figure 19:
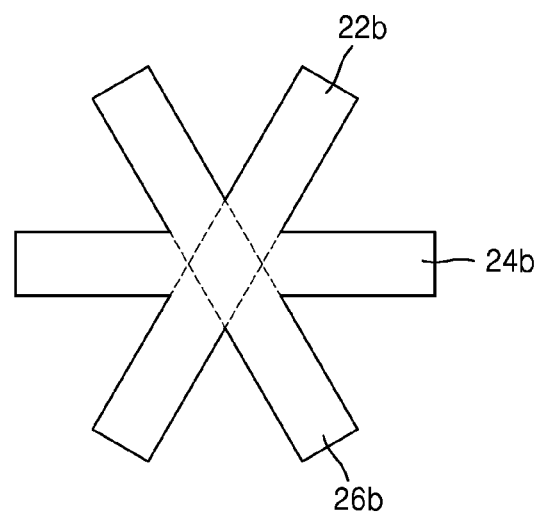
Figure 20:
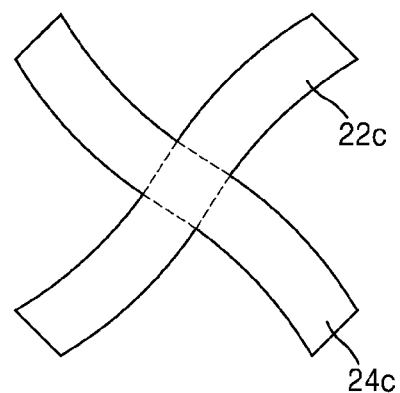

FIGS. 18 to 20 are views illustrating examples of meta atoms applicable to a graphene device 100 according to exemplary embodiments. As illustrated in FIG. 18, a meta atom 20a may include a first sub-meta atom 22a and a second sub-meta atom 24a formed in a cross shape. The first sub-meta atom 22a and the second sub-meta atom 24a may share a central region, and an angle between the first and second sub-meta atoms 22a and 24a may be about 90 degrees. The first and second sub-meta atoms 22a and 24a may reflect light having the same resonance wavelength with a different polarization characteristics. Therefore, the effective wavelength band of the reflected wave may be narrowed.

Alternatively, as illustrated in FIG. 19, a meta atom 20b may include three or more sub-meta atoms. For example, the meta atom 20 may include first through third sub-meta atoms 22b, 24b, and 26b. The first through third sub-meta atoms 22b, 24b, and 26b may share a partial region C. Alternatively, as illustrated in FIG. 20, a meta atom 20c may include a plurality of curved sub-meta atoms 22c and 24c.

While this inventive concept has been particularly shown and described with reference to exemplary embodiments thereof, it will be understood by those skilled in the art that various changes in form and details may be made therein without departing from the spirit and scope of the inventive concept as defined by the appended claims. The exemplary embodiments should be considered in descriptive sense only and not for purposes of limitation. Therefore, the scope of the inventive concept is defined not by the detailed description of the inventive concept but by the appended claims, and all differences within the scope will be construed as being included in the inventive concept.

What is claimed is:

1. A graphene device comprising:
   a substrate;
   an active layer disposed on the substrate, the active layer comprising:
      a plurality of meta atoms, each of the plurality of meta atoms comprising a first branch and a second branch intersecting the first branch, and
      a graphene layer which is in contact with each of the plurality of meta atoms; and
   a dielectric layer disposed on the substrate, wherein the dielectric layer covers the active layer.

2. The graphene device of claim 1, wherein, in at least one of the plurality of meta atoms, the first branch comprises a first sub-meta atom and the second branch comprises a second sub-meta atom which intersects the first sub-meta atom in a shared partial region.

3. The graphene device of claim 2, wherein at least one of the first sub-meta atom and the second sub-meta atom has a bar shape.

4. The graphene device of claim 2, wherein at least one of the first sub-meta atom and the second sub-meta atom is symmetric with respect to the partial region.

5. The graphene device of claim 2, wherein both of the first sub-meta atom and the second sub-meta atom are symmetric with respect to an axis passing through the partial region.

6. The graphene device of claim 2, wherein at least one of the first sub-meta atom and the second sub-meta atom has a length which is shorter than a wavelength of light in a mid-infrared band.

7. The graphene device of claim 6, wherein at least one of the first sub-meta atom and the second sub-meta atom atoms has a length of about 1 μm to about 10 μm.

8. The graphene device of claim 2, wherein the first sub-meta atom has a thickness which is shorter than a length of the first sub-meta atom.

9. The graphene device of claim 8, wherein each of the plurality of meta atoms has a thickness of about 50 nm to about 300 nm.

10. The graphene device of claim 1, wherein the plurality of meta atoms are arranged in a two-dimensional lattice array.

11. The graphene device of claim 1, wherein at least one of the plurality of meta atoms comprises metal.

12. The graphene device of claim 11, wherein the metal comprises gold.

13. The graphene device of claim 1, wherein a dielectric constant of the dielectric layer is greater than a dielectric constant of the graphene layer.

14. The graphene device of claim 1, wherein the dielectric layer comprises an ion-gel.

15. The graphene device of claim 1, wherein each of the plurality of meta atoms contacts the substrate.

16. The graphene device of claim 1, wherein the graphene layer contacts the substrate.

17. The graphene device of claim 1, wherein the substrate is an insulating substrate.

18. The graphene device of claim 17, wherein the substrate is a sapphire substrate.

19. The graphene device of claim 1, further comprising:
   a first electrode disposed on the substrate and in contact with the dielectric layer.

20. The graphene device of claim 19, wherein a dielectric constant of the graphene layer is variable and is dependent on a voltage applied to the first electrode.

21. The graphene device of claim 19, further comprising:
   a second electrode disposed on the substrate and a third electrode disposed on the substrate, wherein the third electrode is disposed between the second electrode and the first electrode.

22. The graphene device of claim 1, wherein light incident on the graphene device induces a current at an interface between the graphene layer and the plurality of meta atoms.

23. The graphene device of claim 22, wherein the current induced at the interface between the graphene layer and the plurality of meta atoms reflects light in a specific wavelength band.

24. The graphene device of claim 23, wherein the wavelength of the light in the specific wavelength band is dependent on a dielectric constant of the graphene layer.

25. The graphene device of claim 22, wherein the light incident on the graphene device which induces the current at the interface between the graphene layer and the plurality of meta atoms comprises light in a mid-infrared band.

26. The graphene device of claim 21, wherein both the second electrode and the third electrode contact the active layer.

* * * * *